(12) United States Patent
Souriau

(10) Patent No.: US 8,928,141 B2
(45) Date of Patent: Jan. 6, 2015

(54) METHOD FOR FABRICATING TWO SUBSTRATES CONNECTED BY AT LEAST ONE MECHANICAL AND ELECTRICALLY CONDUCTIVE CONNECTION AND STRUCTURE OBTAINED

(75) Inventor: Jean-Charles Souriau, Saint Egreve (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 0 days.

(21) Appl. No.: 13/983,201

(22) PCT Filed: Jan. 31, 2012

(86) PCT No.: PCT/FR2012/000042
§ 371 (c)(1),
(2), (4) Date: Aug. 1, 2013

(87) PCT Pub. No.: WO2012/104507
PCT Pub. Date: Aug. 9, 2012

(65) Prior Publication Data
US 2013/0313704 A1    Nov. 28, 2013

(30) Foreign Application Priority Data

Feb. 2, 2011 (FR) .................................. 11 00327

(51) Int. Cl.
| H01L 23/48 | (2006.01) |
| H01L 23/52 | (2006.01) |
| H01L 29/40 | (2006.01) |
| H01L 23/00 | (2006.01) |
| H01L 25/065 | (2006.01) |
| H01L 25/00 | (2006.01) |
| H01L 21/56 | (2006.01) |
| H01L 23/498 | (2006.01) |

(52) U.S. Cl.
CPC ................ *H01L 24/81* (2013.01); *H01L 24/13* (2013.01); *H01L 24/16* (2013.01); *H01L 25/0657* (2013.01); *H01L 25/50* (2013.01);
(Continued)

(58) Field of Classification Search
USPC .......................................... 438/615; 257/785
See application file for complete search history.

(56) References Cited

U.S. PATENT DOCUMENTS

| 6,179,198 B1 * | 1/2001 | Eifuku et al. ............ 228/180.22 |
| 8,779,588 B2 * | 7/2014 | Yu et al. ........................ 257/737 |

(Continued)

FOREIGN PATENT DOCUMENTS

| FR | 2 928 033 A1 | 8/2009 |
| JP | A-2010-287640 | 12/2010 |

OTHER PUBLICATIONS

International Preliminary Report on Patentability issued in International Patent Application No. PCT/FR2012/000042 mailed Aug. 6, 2013.

(Continued)

*Primary Examiner* — Wensing Kuo
*Assistant Examiner* — Shaka White
(74) *Attorney, Agent, or Firm* — Oliff PLC

(57) ABSTRACT

A first substrate provided with a receiving area made from a first metallic material is supplied. A second substrate provided with an insertion area comprising a base surface and at least two bumps made from a second metallic material is arranged facing the first substrate. The bumps are salient from the base surface. A pressure is applied between the first substrate and the second substrate so as to make the bumps penetrate into the receiving area. The first metallic material reacts with the second metallic material so as to form a continuous layer of an intermetallic compound having a base formed by the first and second metallic materials along the interface between the bumps and the receiving area.

7 Claims, 4 Drawing Sheets

(52) U.S. Cl.
CPC ............... H01L 24/10 (2013.01); *H01L 21/563* (2013.01); *H01L 2224/13078* (2013.01); *H01L 2224/13099* (2013.01); *H01L 2224/13109* (2013.01); *H01L 2224/13111* (2013.01); *H01L 2224/13113* (2013.01); *H01L 2224/13116* (2013.01); *H01L 2224/1312* (2013.01); *H01L 2224/13139* (2013.01); *H01L 2224/13147* (2013.01); *H01L 2224/13155* (2013.01); *H01L 2224/1316* (2013.01); *H01L 2224/13164* (2013.01); *H01L 2224/13169* (2013.01); *H01L 2224/16145* (2013.01); *H01L 2224/81193* (2013.01); *H01L 2224/81203* (2013.01); *H01L 2224/8121* (2013.01); *H01L 2224/8181* (2013.01); *H01L 2224/81815* (2013.01); *H01L 2224/83192* (2013.01); *H01L 2924/01013* (2013.01); *H01L 2924/01029* (2013.01); *H01L 2924/01047* (2013.01); *H01L 2924/01049* (2013.01); *H01L 2924/01051* (2013.01); *H01L 2924/01058* (2013.01); *H01L 2924/01079* (2013.01); *H01L 2924/01082* (2013.01); *H01L 2924/09701* (2013.01); *H01L 2224/81825* (2013.01); *H01L 2224/16227* (2013.01); *H01L 2224/73204* (2013.01); *H01L 2225/06517* (2013.01); *H01L 2924/00013* (2013.01); *H01L 2924/0105* (2013.01); *H01L 2924/01078* (2013.01); *H01L 2225/06513* (2013.01); *H01L 2225/06565* (2013.01); *H01L 2224/1601* (2013.01); *H01L 2224/13011* (2013.01); *H01L 2924/01327* (2013.01); *H01L 23/49811* (2013.01); *H01L 2224/16225* (2013.01)

USPC ....... 257/737; 257/758; 257/E21.48; 438/612

(56) References Cited

U.S. PATENT DOCUMENTS

| | | |
|---|---|---|
| 2002/0104873 A1 | 8/2002 | Lee et al. |
| 2006/0091504 A1 | 5/2006 | Kang et al. |
| 2007/0152331 A1 | 7/2007 | Kang et al. |
| 2008/0146071 A1* | 6/2008 | Davoine et al. ............... 439/387 |
| 2011/0094789 A1 | 4/2011 | Marion et al. |

OTHER PUBLICATIONS

Lee et al., "Assessment of Fluxless Solid Liquid Interdiffusion Bonding by Compressive Force of Au—PbSn and Au—SAC for Flip Chip Packaging," *IEEE Transactions on Advanced Packaging*, Feb. 2009, vol. 32, No. 1, pp. 116-122.

Saint-Patrice et al., "New Reflow Soldering and Tip in Buried Box (T B2) Techniques for Ultrafine Pitch Megapixels Imaging Array," *Electronic Components and Technology Conference*, May 2008, pp. 1-8.

* cited by examiner

METHOD FOR FABRICATING TWO SUBSTRATES CONNECTED BY AT LEAST ONE MECHANICAL AND ELECTRICALLY CONDUCTIVE CONNECTION AND STRUCTURE OBTAINED

BACKGROUND OF THE INVENTION

The invention relates to a method for securing two substrates to one another.

STATE OF THE ART

In the field of electronic chips, it is commonplace to use different elementary chips incorporating different technologies and functions in order, as a final result, to form a complex circuit which meets predefined requirements.

In certain particular cases, one or more chips are produced specifically to be used in a given final circuit. Under these conditions, the particularities of each chip are taken into account when the latter are fabricated. This enables the required synergy between the different components to be obtained. However, it must be admitted that this approach is very limited as it is costly. One or more chips are in fact "made to measure" for the final circuit which limits or even eliminates their use in other circuits.

In order to reduce production costs, it is very advantageous to take already existing chips and to assemble them in order to take advantage of the specific features of each of the chips. The field of interconnection of the chips in order to obtain a final device that is functional and of reasonable size then becomes a major issue.

In order to reduce the distance separating two chips, it is proposed to perform connection of these two elements by means of an intermetallic compound.

As illustrated in FIGS. 1 to 3, a first flat contact area 1 is formed at the surface of a first substrate 2. First contact area 1 is made from a first metallic material. A second flat contact area 3 is formed at the surface of a second substrate 4. Second contact area 3 is made from a second metallic material. The two areas 1 and 3 are placed in contact (FIG. 2) and undergo heat treatment which forms an intermetallic compound 5 at the interface between the two metallic materials (FIG. 3).

As the intermetallic compound deforms fairly badly plastically, this architecture is subject to breaking of the connection due to the effect of mechanical stresses. The mechanical stress results for example from the difference of coefficient of expansion between the different metallic materials. It is observed that the resistance in time of this device is not satisfactory.

The publication by Saint-Patrice et al. ("New Reflow Soldering and Tip in Buried Box (TB2) Technique for Ultrafine Pitch Megapixels Imaging Array" Electronic Components and Technology Conference, May 2008 ECTC 2008) describes a method for securing two substrates by means of an indium ball inside which a hollow tube is sunk. Tests were carried out with the hollow tube being covered by a layer of gold and without this covering. Different tests were performed with this architecture without being able to show an improvement of the mechanical performances of this kind of structure.

OBJECT OF THE INVENTION

It is observed that a requirement exists to provide a device having a better mechanical strength as well as a method for producing this type of device that is easy to implement.

This requirement tends to be satisfied by means of a device which comprises:
  a first substrate provided with a receiving area made from a first metallic material,
  a second substrate provided with an insertion area,
  the insertion area comprising a base surface from which at least two bumps made from a second metallic material are salient,
  the bumps penetrating into the same receiving area to form a mechanical and electric connection between the first and second substrate,
  a layer of an intermetallic compound made from first and second metallic materials each separating at least two bumps and the receiving area, the at least two layers of metallic compound being separated by an area made from the first metallic material.

Such a device can be obtained by means of a fabrication method which comprises the following steps:
  providing a first substrate provided with a receiving area made from a first metallic material and a second substrate provided with an insertion area comprising a base surface and at least two bumps made from a second metallic material, the bumps being salient from the base surface,
  applying a pressure between the first substrate and the second substrate so as to make the bumps penetrate into the receiving area of the first substrate,
  making the first metallic material react with the second metallic material so as to form a continuous layer of an intermetallic compound formed by the first and second metallic materials along the interface between the bumps and the receiving area, the two layers of intermetallic compound being separated by an area made from the first metallic material.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
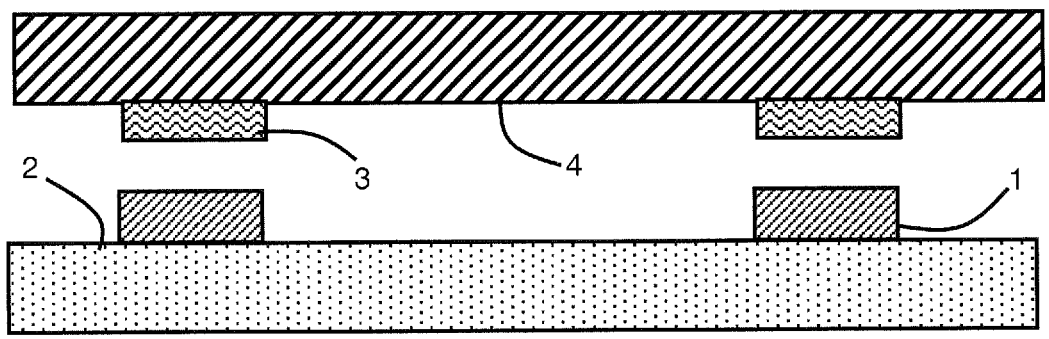
FIGS. 1 to 3 represent, in schematic manner, cross-sectional views of the successive steps of implementation of a first method.
Figure 2:
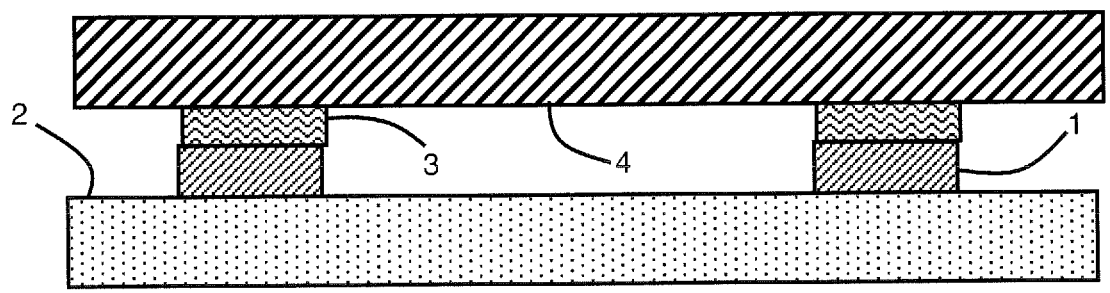
Figure 3:
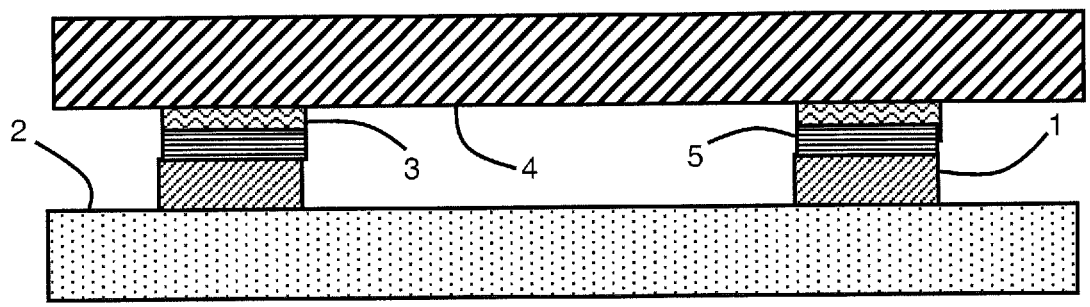
Figure 4:
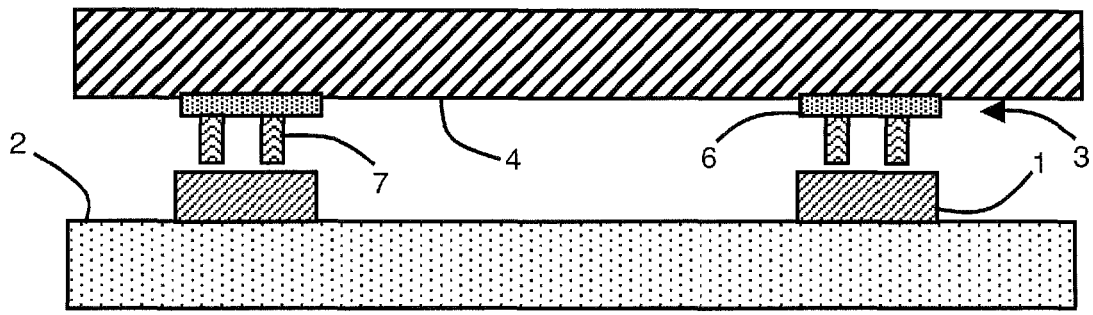
FIGS. 4 to 6 represent, in schematic manner, cross-sectional views of the successive steps of implementation of a second method.

As illustrated in FIG. 4, a first substrate 2 comprises a main surface with an electric connection formed by a receiving area 1. Receiving area 1 is formed by a first metallic material. Receiving area 1 advantageously presents a flat free surface. However, in certain embodiments, the free surface can present a surface topography. The free surface is a surface that is uncovered or that can be covered by any material such as an oxide.

A second substrate 4 is used and it comprises a main surface with an electric connection formed by an insertion area 3. Insertion area 3 presents a surface topography which can be represented by a substantially flat base surface 6 at the surface of which a bump 7 is salient. Bump 7 is formed by a second metallic material. In certain embodiments, bump 7 and base surface 6 are formed from the second metallic material. In other embodiments, bump 7 and base surface 6 are formed from different materials. Bump 7 is secured to second substrate 4 by means of base surface 6. Bump 7 is in electric contact with the second substrate or active devices located on second substrate 4 by means of base surface 6. The first substrate and/or second substrate can be an electronic chip, a semi-conducting substrate that is blank or comprising active devices, an electronic board which may also be called printed circuit board, a glass or ceramic plate or a flexible substrate for example of polymer type incorporating active devices or not.

If receiving area 1 is covered by an electrically insulating layer or a layer of a different nature, the latter is eliminated before making the connection with the insertion area, or the electrically insulating layer or the layer of different nature is pierced by bumps 7 so as to obtain an intimate contact between bump 7 and receiving area 1. The same is the case if bump 7 is covered by an electrically insulating layer or a layer of different nature.

First 2 and second 4 substrates are placed facing one another so as to enable connection between receiving area 1 and insertion area 3. Receiving area 1 is located facing insertion area 3.

Figure 5:
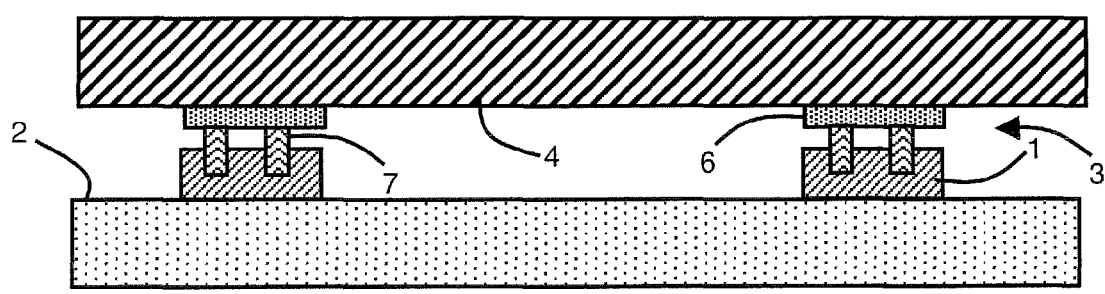

As illustrated in FIG. 5, a pressure is applied on the two substrates 2 and 4 so as to make an intimate contact between receiving area 1 and insertion area 3. Insertion area 3 sinks at least partially into receiving area 1. Receiving area 1 is deformed due to the action of the pressure exerted by insertion area 3. In a cross-sectional plane parallel to the main surface of first substrate 2 and passing through receiving area 1, bump 7 and receiving area 1 have complementary surfaces. The bump is preferably solid which enables formation of the intermetallic compound to be better controlled.

The first metallic material is a tender material which allows penetration of bump 7 made from second metallic material without being damaged. The second metallic material is a hard material which penetrates into receiving area 1 without deforming too much or being degraded.

The first metallic material is a material having a hardness that is lower than that of the second metallic material. In preferential manner, the first metallic material presents a Brinell hardness less than or equal to 60 MPa or a Mohs hardness less than or equal to 2. Such a limit value enables deformation of the receiving area to be performed in simple manner without having to apply high stresses in the rest of the substrate. The first metallic material is for example tin, lead, indium or a tin and/or indium-based alloy or an alloy formed by one or more of these materials.

The second metallic material advantageously presents a Brinell hardness greater than or equal to 200 MPa or a Mohs hardness greater than or equal to 2.5. Such a limit value enables deformation of the contact area to be performed in simple manner without deforming insertion area 3 or having to apply high stresses in the rest of the substrate. The second metallic material is preferably nickel or copper or an alloy containing nickel and/or copper. The second metallic material can again advantageously be iron, antimony, gold, bismuth, silver, palladium or platinum or an alloy having formed by one or more of these materials.

It is possible to indifferently use the materials advantageously cited for the first metallic material as material able to be used for the second metallic material and vice-versa. The choice of materials is mainly made in such a way as to have a first metallic material that is more tender than the second metallic material thereby enabling penetration of the bump 7 into receiving area 1 which is more favourable for creation of an intermetallic compound.

In preferential manner, the hardness ratio between the material of insertion bump 7 and the material of receiving area 1 is greater than or equal to 2 so as to fully master penetration of the bump. The hardness ratio is taken on the same type of hardness, for example the Vickers hardness, Brinell hardness or Mohs hardness.

Figure 6:
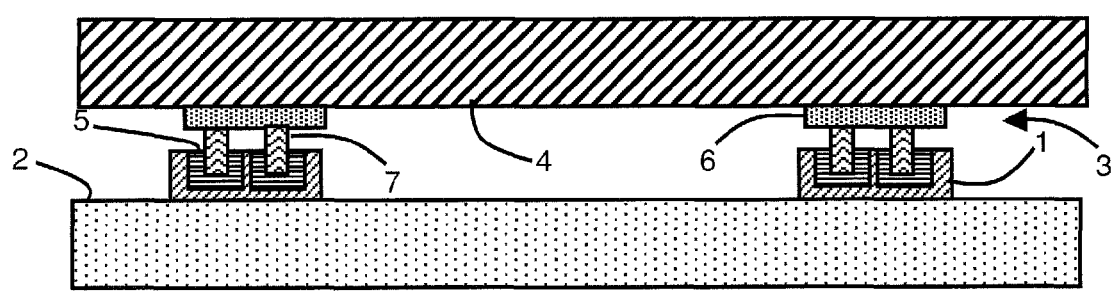

As illustrated in FIG. 6, once insertion bump 7 has been embedded in receiving area 1, predefined operating conditions are applied in order to make the first metallic material react with the second metallic material. The first metallic material reacts with the second metallic material in order to form a intermetallic compound 5 also called intermetallic. Heat treatment can be applied to make the first metallic material react with the second metallic material at a higher temperature than the ambient temperature. In certain embodiments, formation of intermetallic compound 5 can begin as soon as bump 7 is placed in contact with receiving area 1 and as soon as a certain pressure is reached.

In conventional manner, the speed of reaction increases with the temperature of the heat treatment. It is also possible to obtain or to accelerate the reaction between the two metallic materials by maintaining the compression after bump 7 has penetrated into receiving surface 1. It is also possible to combine the latter two embodiments.

Intermetallic compound 5 is a material with an alternation of the constitutive atoms which form a periodic structure and which presents particular mechanical properties. The intermetallic compound is an alloy between two metallic materials.

If the first and second metallic materials are made from nickel and tin, the material for is for example the intermetallic compound $Ni_3Sn$, $Ni_3Sn_2$, $Ni_3Sn_4$ or $NiSn_3$. If receiving area 1 is no longer made from tin but from indium, it is possible to form $Ni_3In$, $NiIn$, $Ni_2In_3$ or $Ni_3In_7$. If the bump is made from copper, it is then possible to form $Cu_6Sn_5$, $Cu_3Sn$, $Cu_3In$, $Cu_9In_4$. Different intermetallic compounds 5 can be formed from tin, lead and indium on the one hand and from copper, nickel, iron, indium, antimony, bismuth, silver, palladium and platinum on the other hand. Intermetallic compound 5 ensures a better mechanical connection in comparison with a simple connection by engagement. The intermetallic compound also enables an electric current to flow between first substrate 2 and second substrate 4.

The first and second materials and the operating conditions when bump 7 is inserted in receiving area 1 and/or heat treatment is performed to form intermetallic compound 5 are chosen in such a way as to prevent formation of an intermetallic compound 5 with interdiffusion and phase transformation preventing formation of a continuous film at the interface between bump 7 and receiving area 1. Such conditions occur for example with gold and indium which form the compound $AuIn_2$, interdiffusion and phase transformation of which take place at ambient temperature, which results in complete consumption of the first and/or second metallic material. This also results in formation of the intermetallic compound in the core of the bump and/or in the core of receiving area 1 and not at the interface between these two elements.

The diameter of the bumps and the volume of the receiving area are chosen in such a way that the intermetallic compound does not form in the whole volume of the receiving area during the lifetime of the structure. This precaution prevents having complete consumption of the material forming the receiving area and/or the bump with fragilization of the final structure. This also enables the structure to be devoid of a void area inside the volume delineated by a hollow bump which is detrimental to achieving a good mechanical strength.

Compound 5 is formed at the interface between the first metallic material and the second metallic material. Intermetallic compound 5 thus follows the depression of bump 7 inside receiving area 1. The film of intermetallic compound 5 is no longer flat as in the prior art. It presents lateral surfaces, i.e. surfaces that are not parallel to the main surface of first substrate 2. The intermetallic compound follows the surface of bump 7 in receiving area 1.

Intermetallic compound 5 forms the separation of the second metallic material of bump 7 with receiving area 1 made from the first material which has the effect of strengthening the cohesion of the two substrates. The vertical component of intermetallic compound 5 enables a better resistance to shearing forces to be obtained. The particular shape of the layer of intermetallic compound 5 combined with depression of bump 7 into receiving area 1 in general manner enables a connection to be obtained that is less sensitive to mechanical stresses.

In a particular embodiment, bump 7 penetrates into and passes through receiving area 1, for example to penetrate into first substrate 2. In this case, intermetallic compound 5 is formed at the interface between the two metallic materials and the part of bump 7 which is in contact with first substrate 2 can be devoid of intermetallic compound. The intermetallic material forms a continuous film at the interface between the first metallic material and the second metallic material, but it is not present outside this interface, for example at the interface between the bump and the first substrate.

In preferential manner, intermetallic compound 5 prevents any direct contact between bump 7 and receiving area 1 thereby preventing formation of an area that is mechanically more fragile for example to shearing forces.

In a conceivable particular embodiment, the heat treatment is performed as soon as the two substrates are brought into contact in order to facilitate penetration of the bump into receiving area 1. The heat treatment can serve the purpose of softening receiving area 1 which enhances penetration into receiving area 1. The heat treatment can also accelerate the speed of reaction to form intermetallic compound 5.

In a particular embodiment, the heat treatment enables receiving area 1 to be at least partially melted. This partial melting accelerates the formation of intermetallic compound 5 and reduces the pressure to be exerted between substrates 2 and 4.

The heat treatment applied to the structure is chosen so as to control the mobility of the atoms of the first and second metallic materials. In a particular embodiment, the temperature of the structure is increased in order to enhance the mobility of the atoms of the first and second metallic materials without however going as far as melting of the receiving area. Modulation of the temperature of the structure during formation of the intermetallic compound enables the thickness of the intermetallic compound to be controlled.

In a preferred embodiment, at least 20% of the initial volume of the bump does not react with the metallic material of the receiving area. In this manner, bump 7 conserves a sufficient volume to maintain a good mechanical cohesion between the different elements of the structure.

Figure 7:
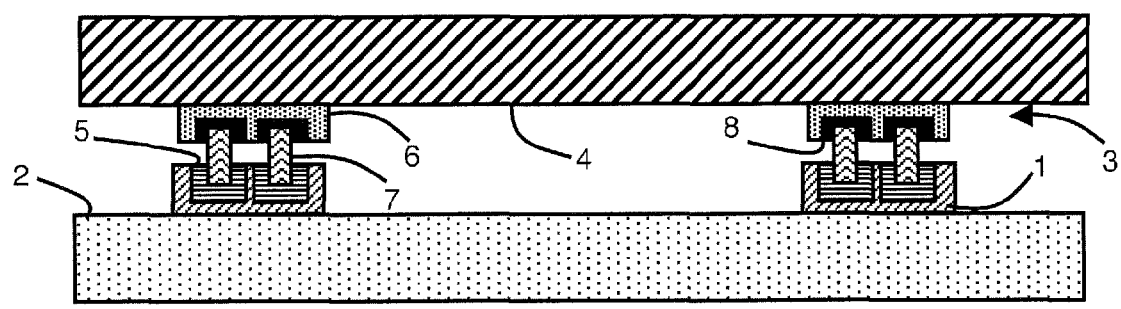
FIG. 7 represents, in schematic manner, a cross-sectional view of a first alternative embodiment of the structure.

In an alternative embodiment illustrated in FIG. 7, base surface 6 of insertion area 3 is made from a third metallic material which is a tender material. When the pressure is applied between first 2 and second 4 substrates, bump 7 made from second metallic material penetrates into the first and third metallic materials. When the heat treatment is applied, two different intermetallic compounds are thereby formed. A first intermetallic compound 5 is formed between the first and second metallic material and a second intermetallic compound 8 is formed between the third and second metallic material. Bump 7 is separated from receiving area 1 and from base surface 6 by intermetallic compounds 5, 8.

The operating conditions, in particular the heat treatment for formation of intermetallic compound 5, are chosen to prevent dissolution of the first and/or second metallic material. The mechanical and electric connection between first 2 and second 4 substrates therefore comprises a part made from first metallic material, a part made from second metallic material and the intermetallic compound at the interface.

In an embodiment illustrated in FIGS. 4 to 11, several bumps 7 are arranged to penetrate into the same monoblock receiving area 1. Bumps 7 are sufficiently spaced apart from one another so that a part of the material of receiving area 1 does not react between two adjacent bumps 7. For example, at least two bumps 7 are configured to penetrate into the same receiving area 1. At least two continuous layers of intermetallic compound 5 are formed in receiving area 1 to separate each bump 7 of first material from receiving area 1. The two layers made from the intermetallic compound are separated by an area made from first metallic material along an axis which connects first bump 7 to second bump 7. In advantageous manner, separation between the two layers of compound 5 is complete.

In this manner, in a cross-sectional plane parallel to the main surface of the first and/or second substrates, it is observed that the two areas made from intermetallic compound 5 are separated by the first metallic material of receiving area 1 as can be seen in FIG. 6. This configuration enables an area that is less hard to be created between the two bumps 7. This part of receiving area 1 can be formed plastically so as to absorb the stresses induced when mechanical and/or thermal shocks occur. Bump 7 is thus separated from receiving area 1 by intermetallic compound 5 and two adjacent areas made from intermetallic compound are separated by the first intermetallic material of receiving area 1. In advantageous manner, there is continuity of the area made from first metallic material in the receiving area, which facilitates absorption of the stresses.

Figure 8:
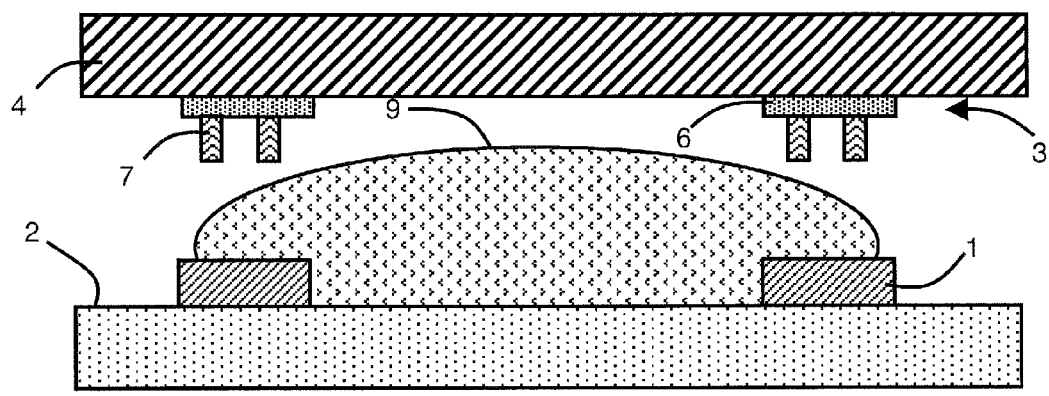
FIGS. 8 to 10 represent, in schematic manner, cross-sectional views of the successive steps of implementation of a third method.

In another preferred embodiment of the invention which can be combined with the previous embodiments and which is illustrated in FIG. 8, glue 9 is deposited on one of the substrates. When connection of the substrates is performed by application of a pressure and of the heat treatment to form intermetallic compound 5, the glue reacts to form a second mode of securing the substrates to one another.

Figure 9:
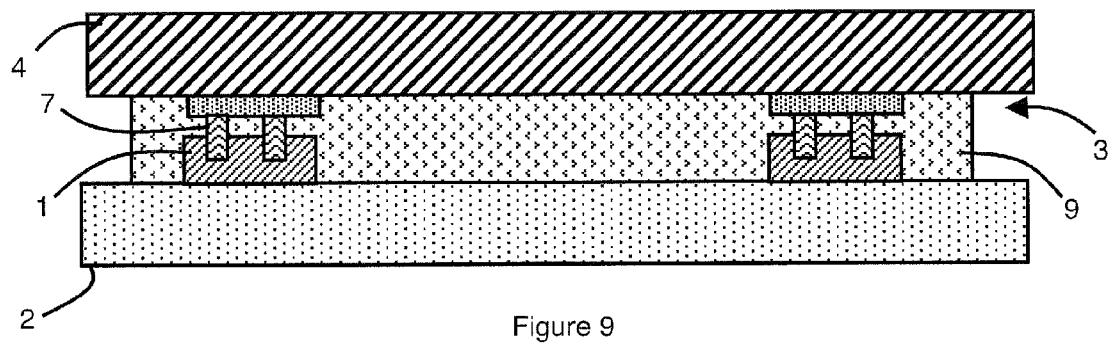

As illustrated in FIG. 9, the pressure exerted to make bump 7 penetrate into receiving area 1 enables glue 9 to be spread over the surface of the substrates.

Figure 10:
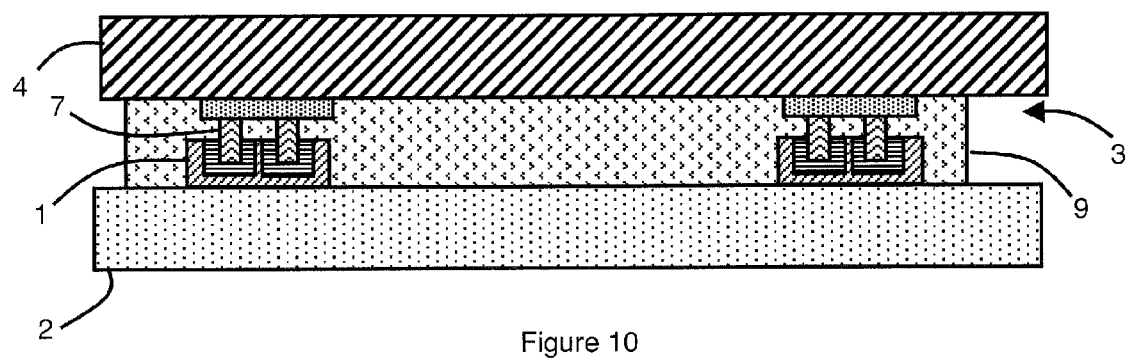

As illustrated in FIG. 10, the heat treatment used to form intermetallic compound 5 enables the glue to be fluidized and/or polymerization to be performed.

Figure 11:
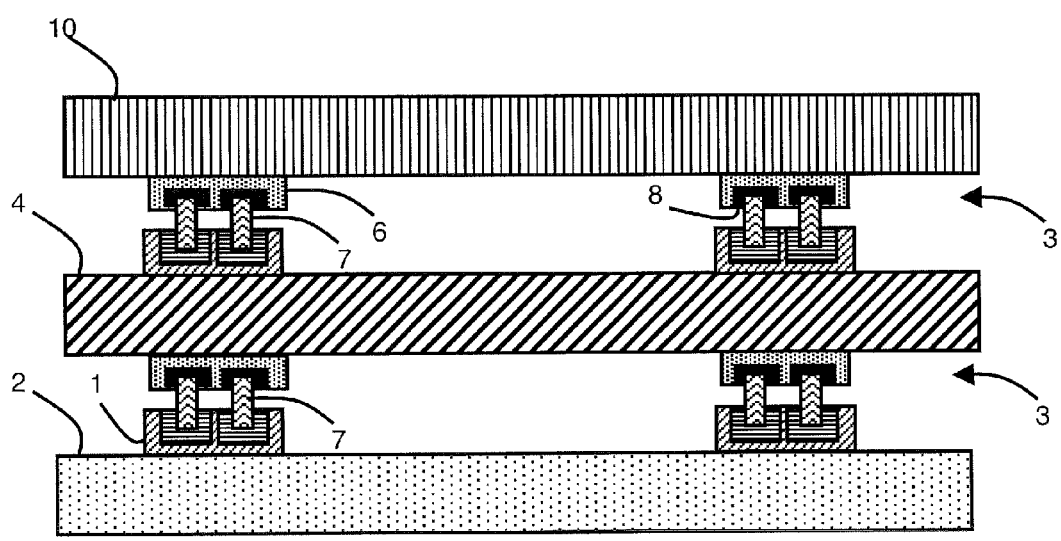
FIG. 11 represents, in schematic manner, a cross-sectional view of a second alternative embodiment of the structure.

In an alternative embodiment illustrated in FIG. 11, a third substrate 10 is associated with first substrate 2 or second substrate 4. As in the previous embodiment, one of the two substrates comprises a receiving area 1 and the other substrate comprises an insertion area 3 with a salient bump. Receiving area 1 and insertion area 3 are placed facing one another and a pressure is exerted so that bump 7 penetrates into receiving area 1. Heat treatment is then performed to form an intermetallic compound 5. This particular case can naturally be extended to connection of a larger number of substrates.

It is possible to use the same materials or different materials between the connections of the different substrates.

In a preferred embodiment, the same heat treatment is used to form the intermetallic compound between first second 2 and second 4 substrate and between the third substrate and first 2 or second 4 substrate.

In another alternative embodiment, first 2, second 4 and third 10 substrates are associated in such a way that each receiving area 1 is facing an insertion area 3. A pressure is applied on the whole assembly so as to make bump 7 penetrate into the associated receiving area 1. In this manner, bump 7 of second substrate 4 deforms receiving area 1 of first substrate 2 at the same time as a similar action is performed with third substrate 10. Third substrate 10 can be associated with first substrate 2 or with second substrate 4 and it can comprise a receiving area 1 or an insertion area 3.

For example, first substrate 2 can be associated with second 4 and third 10 substrates which are then located on opposite main surfaces of first substrate 2. Second substrate 4 is separated from third substrate 10 by first substrate 2. In another embodiment, second 4 and third 10 substrates are located on the same main surface of first substrate 2 and are adjacent.

Several receiving areas 1 and/or several insertion areas 3 can be formed on the same substrate. It is thus possible to form a receiving area 1 next to an insertion area 3 on the main surface of a substrate.

In an embodiment which can be combined with the previous embodiments, bump 7 made from second metallic material and/or receiving area 1 is covered by a metallic covering material 11. Covering material 11 is for example a material that is able to be used as first or second metallic material. This enables it to be deformed when the bump comes into contact with receiving area 1. For example purposes, bump 7 and receiving area 1 are covered by a noble material, for example gold which prevents oxidation of bump 7 and receiving area 1. The gold is present at least partially between bump 7 and receiving area 1. The gold does not impede formation of intermetallic compound 5 between the first material and the second material and it can form another intermetallic compound.

This embodiment enables the electric contacts on first 2 and second 4 substrates to be protected by preventing formation of an electrically insulating oxide. This also enables a reliable electric and mechanical connection to be formed between the two substrates without having to previously eliminate covering layer 11.

The invention claimed is:

1. A method for securing two substrates comprising the following steps:
providing a first substrate provided with a monoblock receiving area made from a first metallic material and a second substrate provided with an insertion area including a base surface and at least two bumps made from a second metallic material, the at least two bumps being salient from the base surface,
applying a pressure between the first substrate and the second substrate so as to make the at least two bumps penetrate into the receiving area of the first substrate, and
making the first metallic material react with the second metallic material of the at least two bumps so as to form at least two continuous layers of an intermetallic compound along the interface between each of the at least two bumps and the receiving area, the intermetallic compound being formed by the first and second metallic materials, the at least two continuous layers of intermetallic compound being separated by an area made from the first metallic material.

2. The method according to claim 1, wherein a heat treatment is performed during applying the pressure so as to make the first metallic material react with the second metallic material.

3. The method according to claim 1, wherein the base surface is made from a third metallic material different from the first and second metallic materials, the at least two bumps penetrate into the base surface when the pressure is applied and form an additional intermetallic compound.

4. The method according to claim 1, wherein a hardness ratio between the second metallic material and the first metallic material is greater than or equal to two.

5. The method according to claim 2, wherein the heat treatment is configured to melt the first metallic material.

6. The method according to claim 1, comprising:
placing a third substrate in contact with the first substrate or the second substrate by means of an additional receiving area and an additional insertion area,
applying a pressure between the first substrate, second substrate and third substrate and so as to make at least one additional bump of the additional insertion area penetrating into the additional receiving area, and
forming an additional intermetallic compound between the metallic materials forming the at least one additional bump and the additional receiving area.

7. A device comprising:
a first substrate provided with a receiving area made from a first metallic material,
a second substrate provided with an insertion area,
the insertion area comprising a base surface from which at least two bumps made from a second metallic material are salient,
the at least two bumps penetrating into the same receiving area to form a mechanical and electric connection between the first and second substrates, and
at least two layers of an intermetallic compound made from first and second metallic materials separating respectively at least two bumps and the receiving area, the at least two layers of intermetallic compound being separated by an area made from the first metallic material.

* * * * *